United States Patent
Jang

(10) Patent No.: US 8,598,711 B2
(45) Date of Patent: Dec. 3, 2013

(54) SEMICONDUCTOR DEVICE AND METHOD FOR FORMING THE SAME

(75) Inventor: Chi Hwan Jang, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 68 days.

(21) Appl. No.: 12/957,073

(22) Filed: Nov. 30, 2010

(65) Prior Publication Data

US 2012/0013014 A1 Jan. 19, 2012

(30) Foreign Application Priority Data

Jul. 16, 2010 (KR) ........................ 10-2010-0069141

(51) Int. Cl.
*H01L 23/48* (2006.01)
*H01L 23/52* (2006.01)
*H01L 29/40* (2006.01)

(52) U.S. Cl.
USPC ............................ 257/773; 257/774; 257/758

(58) Field of Classification Search
USPC ......... 257/773, 774, 758, 760, 211, 503, 508, 257/635, 759
See application file for complete search history.

(56) References Cited

U.S. PATENT DOCUMENTS

| | | | | |
|---|---|---|---|---|
| 6,737,746 | B2 * | 5/2004 | Matsuura | 257/759 |
| 7,488,630 | B2 * | 2/2009 | Frank et al. | 438/149 |
| 2003/0209726 | A1 * | 11/2003 | Shigeno | 257/200 |
| 2008/0006945 | A1 * | 1/2008 | Lin et al. | 257/758 |
| 2009/0042365 | A1 * | 2/2009 | McDonald | 438/459 |

FOREIGN PATENT DOCUMENTS

| | | |
|---|---|---|
| KR | 1020030054308 A | 7/2003 |
| KR | 1020070006405 A | 1/2007 |
| KR | 1020090001377 A | 1/2009 |

* cited by examiner

*Primary Examiner* — Chuong A. Luu

(57) ABSTRACT

The semiconductor device comprises a metal line configured to be buried in an interlayer insulation layer formed over a semiconductor substrate, a first insulating pattern configured to be formed over the interlayer insulating layer and the first metal line so that the first metal line is exposed, a second insulating pattern configured to be buried between the first insulating patterns so that the first metal line is exposed, and a third insulating pattern configured to be formed over the first insulating pattern and the second insulating pattern so that the first metal line is exposed, thereby reducing the resistance of a contact plug, such that it operates at high speed and requires low power consumption.

17 Claims, 10 Drawing Sheets

SEMICONDUCTOR DEVICE AND METHOD FOR FORMING THE SAME

CROSS-REFERENCE TO RELATED APPLICATION

The priority of Korean patent application No. 10-2010-00069141 filed on Jul. 16, 2010, the disclosure of which is hereby incorporated in its entirety by reference, is claimed.

BACKGROUND OF THE INVENTION

1. Field of the Invention

Embodiments of the present invention relate to a semiconductor device and a method for forming the same, and more particularly to a semiconductor device including a contact plug and a method for forming the same.

2. Background of the Invention

In a manufacturing process of a semiconductor device, it is necessary to form a metal contact plug for electrically coupling a predetermined lower metal line to an upper metal line. However, in recent times, as the semiconductor device is highly integrated and super-miniaturized, it is necessary to more precisely form a metal contact plug for interconnection between metal lines. In addition, as the demand of electrical characteristics and operation speed of the semiconductor device are further increased, a metal contact plug is required to have a more precise structure, lower resistance, and higher reliability.

Generally, although tungsten (W) and aluminum (Al) are basically used to form a metal line and a metal contact plug, the tungsten (W) and the aluminum (Al) may encounter problems caused by electro-migration or stress-migration. In order to solve the problem, a new method for replacing tungsten (W) or aluminum (Al) with copper (Cu) has been proposed.

Copper (Cu) is generally used as a metal line to increase the operating speed of the semiconductor device. Since copper has difficulty in an etching process, the copper (Cu) is formed using a dual damascene process. In the dual damascene process, an etch stop layer and an interlayer insulating layer are laminated in the form of multiple layers and are etched to form a contact hole and a trench, such that a diffusion barrier and a seed layer are formed over the entire structure including the contact hole and the trench. Subsequently, a copper (Cu) line is deposited by an electroplating process and is polished by a chemical mechanical polishing (CMP) process, such that the contact plug and the copper (Cu) line can be simultaneously formed by the dual damascene process.

As the semiconductor device is highly integrated, the difficulty in forming a minute content hole is also increasing. Although a minute contact hole can be properly formed, its contact resistance is increased due to a shortened distance between the neighboring metal lines. As a result, a defect due to high resistance may occur in the semiconductor device, which makes it difficult for the dual damascene process to be applied for a low-power semiconductor device. Further, when the dual damascene process is applied to the manufacturing process of the semiconductor device with a narrowly scaled down contact hole, it is probable that the contact hole is not fully filled up by conductive material and thus creates a void in the contact plug.

If copper (Cu) fills up the contact hole, copper atoms may diffuse into an neighboring device element to cause contamination. In order to prevent the other device elements from being contaminated, a barrier metal layer is generally formed over the surface of the contact hole. However, due to miniaturization, the barrier metal layer cannot be formed thick enough to prevent copper migration.

BRIEF SUMMARY OF THE INVENTION

Various embodiments of the present invention are directed to providing a semiconductor device and a method for forming the same that substantially obviate one or more problems due to limitations and disadvantages of the related art.

An object of the present invention is to provide a semiconductor device which prevents contact resistance from being increased when a contact plug is formed, such that it can solve the conventional problems resulting when a contact hole is reduced in width in proportion to higher integration of the semiconductor device.

In accordance with one aspect of the present invention, a semiconductor device includes a first metal line buried in an interlayer insulation layer formed over a semiconductor substrate, a first insulating pattern formed over the interlayer insulating layer so that the first metal line is exposed, the first insulating pattern having a first portion and a second portion and a second insulating pattern formed between the first and second portions of the first insulating patterns so that the first metal line is exposed, and a third insulating pattern formed over the first insulating pattern and the second insulating pattern so that the first metal line is exposed.

The first insulating pattern and the third insulating pattern may be arranged in directions perpendicular to each other.

The first metal line may be exposed by the first insulating pattern, the second insulating pattern, and the third insulating pattern, wherein the first metal line may be exposed by ⅔~1 times a width of the first metal line.

The first metal line may be exposed in a form of a square.

The second insulating pattern may have an etching ratio different from that of the first insulating pattern or the second insulating pattern.

The second insulating pattern may include a carbon-based material.

Each of the first insulating pattern and the third insulating pattern may include a nitride-, oxide-, or carbide-based material, or includes a polymer-based material having a low dielectric constant (low-K).

The semiconductor may further include a contact plug formed between the first insulating pattern and the second insulating pattern so that the contact plug is coupled to the first metal line; and a second metal line coupled to the contact plug, wherein the second line is located over the first insulating pattern, and between the third insulating patterns.

In accordance with another aspect of the present invention, a method for forming a semiconductor device includes forming a first metal line over a semiconductor substrate, forming a first insulating pattern over the first metal line, the first insulating pattern having a first portion and a second portion, forming a second insulating pattern between the first and second portion of the first insulating patterns, forming a third insulating pattern over the first insulating pattern and the second insulating pattern so that the second insulating pattern is partially exposed, and forming a trench by etching the second insulating pattern using the first insulating pattern and the third insulating pattern as a mask.

The forming of the first insulating pattern may include forming a first insulating layer over the semiconductor substrate including the first metal line, and etching the first insulating layer using a mask to form the first insulating patterns in a line pattern.

The forming of the second insulating pattern may include forming a second insulating layer over the first insulating pattern, and performing a planarization etching process on the second insulating layer so that the first insulating pattern is exposed.

The forming of the third insulating pattern may include forming the third insulating pattern arranged in a direction perpendicular to the first insulating pattern.

The trench may be shaped in a form of a square.

The forming of the trench may be performed by a dry etching process.

The method for forming the semiconductor device may further include forming a contact plug by substantially filling the trench with conductive material.

The method for forming the semiconductor device may further include forming a second metal line between the third insulating patterns such that the second metal line coupled to the contact plug.

In accordance with another aspect of the present invention, a semiconductor device includes a semiconductor substrate, a interlayer insulating layer formed over the substrate, a first metal line buried in the interlayer insulating layer, a first insulating pattern formed over the interlayer insulating layer and being a line pattern, the first insulating pattern having a first portion and a second portion, a second insulating pattern formed between the first and second portions of the first insulating patterns to define a hole-shaped metal interconnection trench exposing the first metal line, and a third insulating pattern formed over the first insulating pattern and the second insulating pattern and being a line pattern running across the first insulating pattern to define a line-shaped trench exposing the metal interconnection trench, the third insulating pattern having a first portion and a second portion.

The semiconductor may further include a metal interconnection plug at least substantially filling in the metal interconnection trench and being electrically coupled to the first metal line, and a second metal line formed between the first and second portions of the third insulating pattern and electrically coupled to the metal interconnection plug.

The semiconductor may further include wherein the first insulating pattern is arranged along a first direction, and the third insulating pattern is arranged along a second direction perpendicular to the first direction.

It is to be understood that both the foregoing general description and the following detailed description of the present invention are exemplary and explanatory and are intended to provide further explanation of the invention as claimed.

BRIEF DESCRIPTION OF THE DRAWINGS

FIGS. 1(i) to 1(iii) illustrate a semiconductor device according to an embodiment of the present invention. FIG. 1(i) is a plan view illustrating the semiconductor device according to an embodiment of the present invention. FIG. 1(ii) is a cross-sectional view illustrating the semiconductor device taken along the line x-x' of FIG. 1(i). FIG. 1(iii) is a cross-sectional view illustrating the semiconductor device taken along the line y-y' of FIG. 1(i).

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
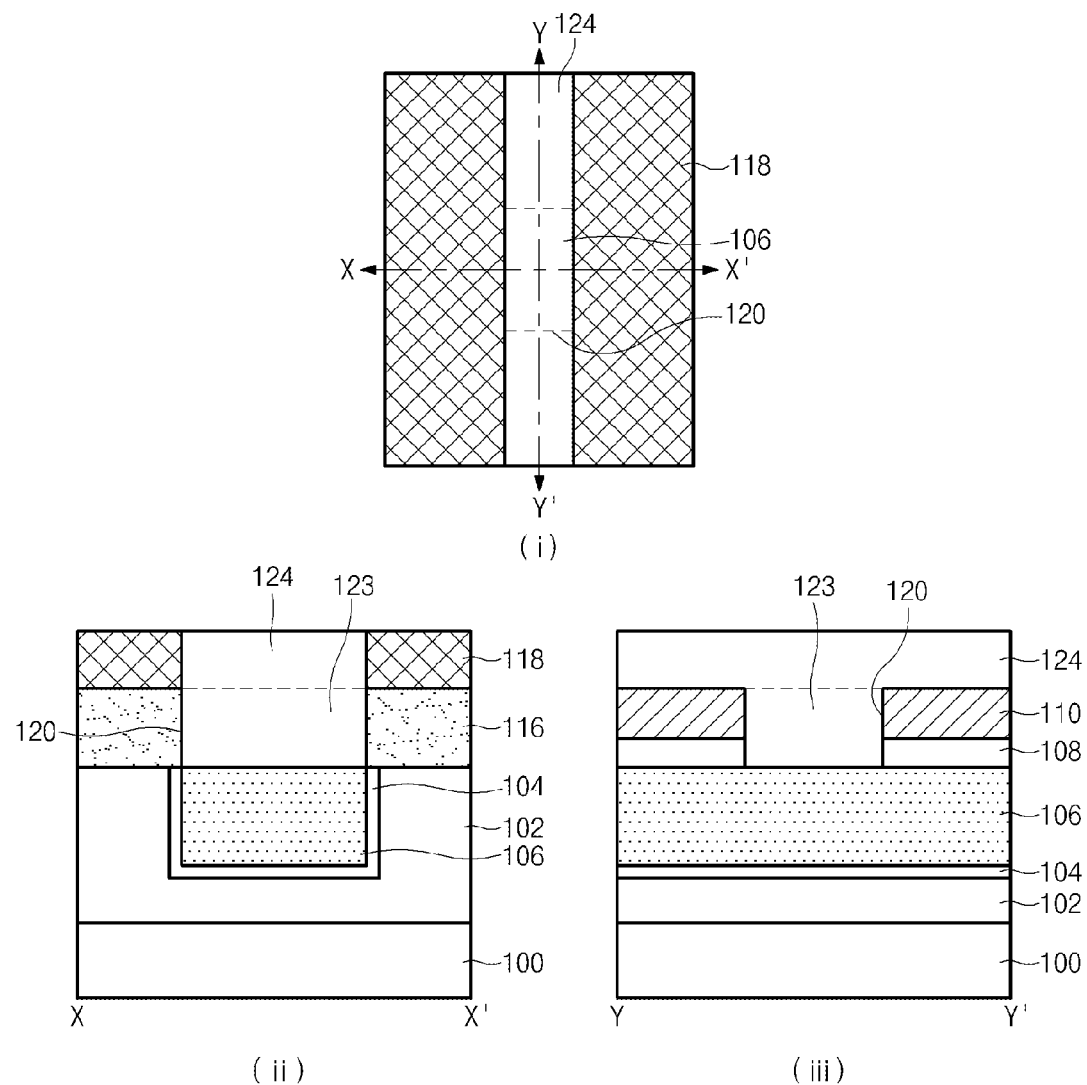
Figure 2:
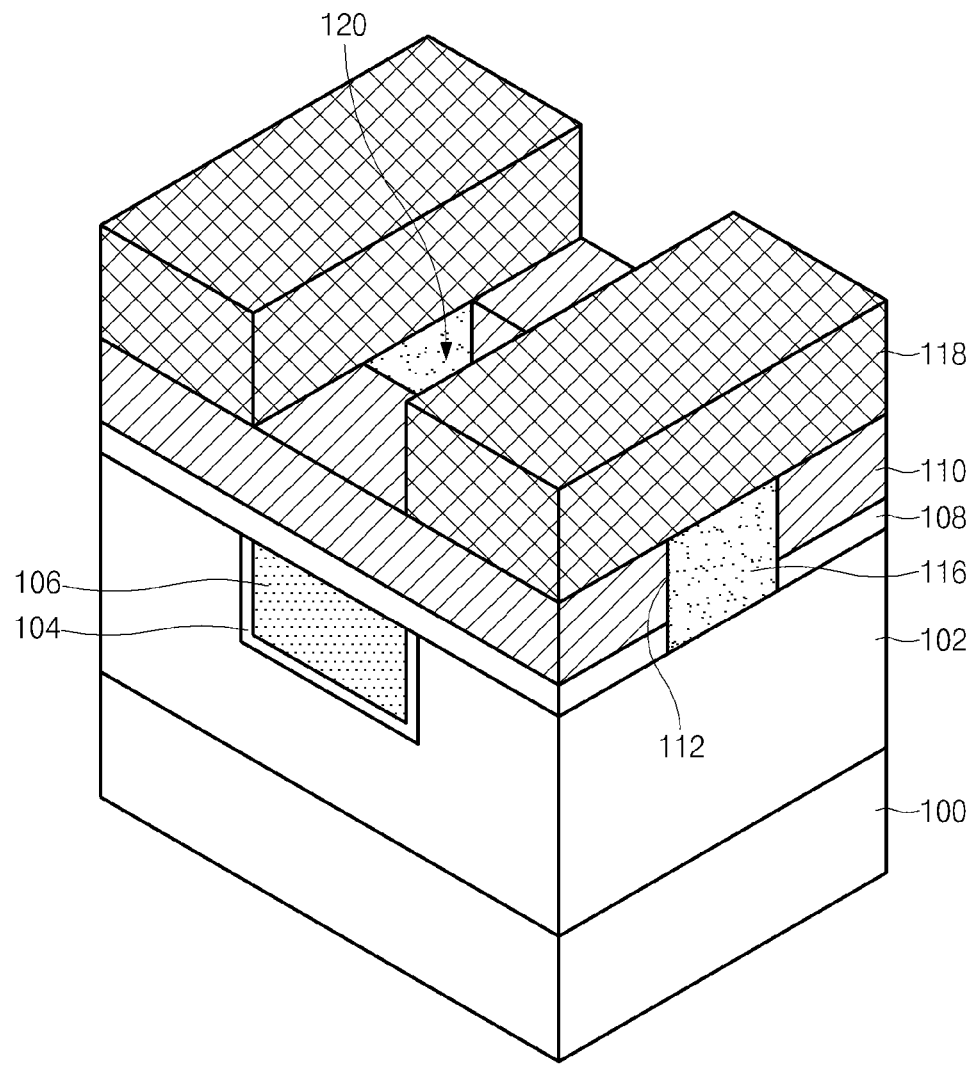
FIG. 2 is a perspective view illustrating a semiconductor device according to an embodiment of the present invention.

FIGS. 1(i) to 1(iii) illustrate a semiconductor device according to an embodiment of the present invention. FIG. 1(i) is a plan view illustrating the semiconductor device according to an embodiment of the present invention. FIG. 1(ii) is a cross-sectional view illustrating the semiconductor device taken along the line x-x' of FIG. 1(i). FIG. 1(iii) is a cross-sectional view illustrating the semiconductor device taken along the line y-y' of FIG. 1(i). FIG. 2 is a perspective view illustrating a semiconductor device according to an embodiment of the present invention.

Referring to FIGS. 1 and 2, the semiconductor device according to an embodiment of the present invention includes an interlayer insulating layer 102 formed over a semiconductor substrate 100, a first metal line 106 buried in the interlayer insulating layer 102, and a contact plug trench 120 contacting the first metal line 106.

In this case, it is preferable that the trench 120 be defined by a first insulating pattern 110 and a third insulating pattern 118. It is preferable that the third insulating pattern 118 be formed over the first insulating pattern 110 and be perpendicular to the first insulating pattern 110.

Preferably, a second insulating pattern 116 located between the first insulating patterns 110 may be located below the third insulating pattern 118. In this case, it is preferable that the second insulating pattern 116 be formed of a material having an etching ratio different from those of the first insulating pattern 110 and the third insulating pattern 118.

In addition, it is preferable that a barrier metal layer 104 be formed at sidewalls and the bottom of the first metal line 106, and a barrier insulation layer 108 be formed below the first insulating pattern 110.

In addition, the semiconductor device according to the embodiment of the present invention may further include a contact plug 123 buried in the contact plug trench 120 and a second metal line 124 located between the third insulating patterns 118. Although FIG. 1 further illustrates a second metal line 124 located between the third insulating patterns 118, the second metal line 124 need not always be formed over the contact plug 123, and the second metal line 124 may be omitted as necessary.

A method for forming the above-mentioned semiconductor device according to the present invention will hereinafter be described in detail.

Figure 3A:
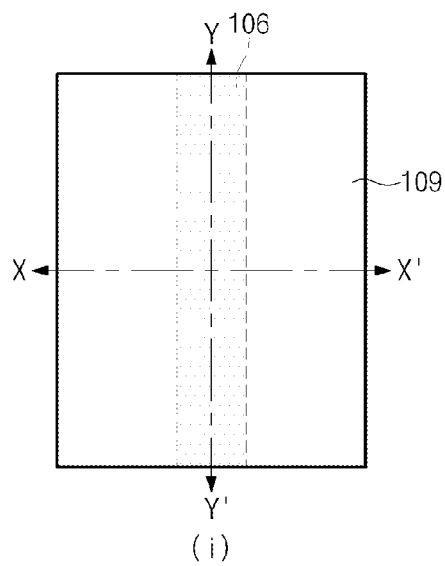
FIGS. 3A to 3H illustrate a method for forming a semiconductor device according to an embodiment of the present invention.
Figure 3A:
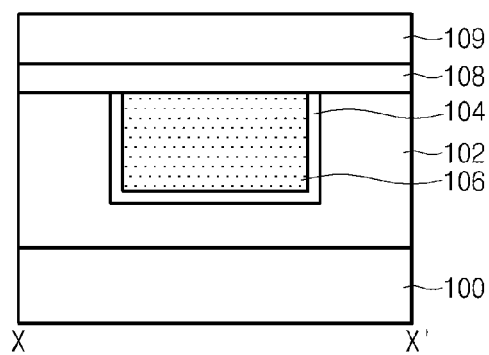
Figure 3A:
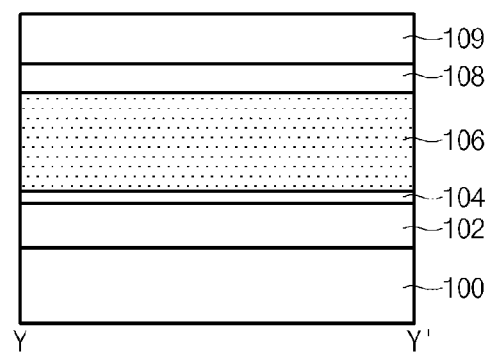

Referring to FIG. 3A, an interlayer insulating layer 102 is formed over the semiconductor substrate 100. After the interlayer insulating layer 102 is etched, the first metal line 106 buried in the interlayer insulating layer 102 is formed. Preferably, the barrier metal layer 104 may be formed below the first metal line 106 before the first metal line 106 is formed. Subsequently, a barrier insulation layer 108 and a first insulating layer 109 are formed over the interlayer insulating layer 102 including the first metal line 106.

In this case, it is preferable that the first insulating layer 109 be formed by a spin coater, a Physical Vapor Deposition (PVD), a Chemical Vapor Deposition (CVD), an Atomic Layer Deposition (ALD), etc. In addition, it is preferable that the first insulating layer 109 be formed of a nitride-, oxide-, or carbide-based material, or be formed of a polymer-based material having a low dielectric constant (low-K).

Figure 3B:
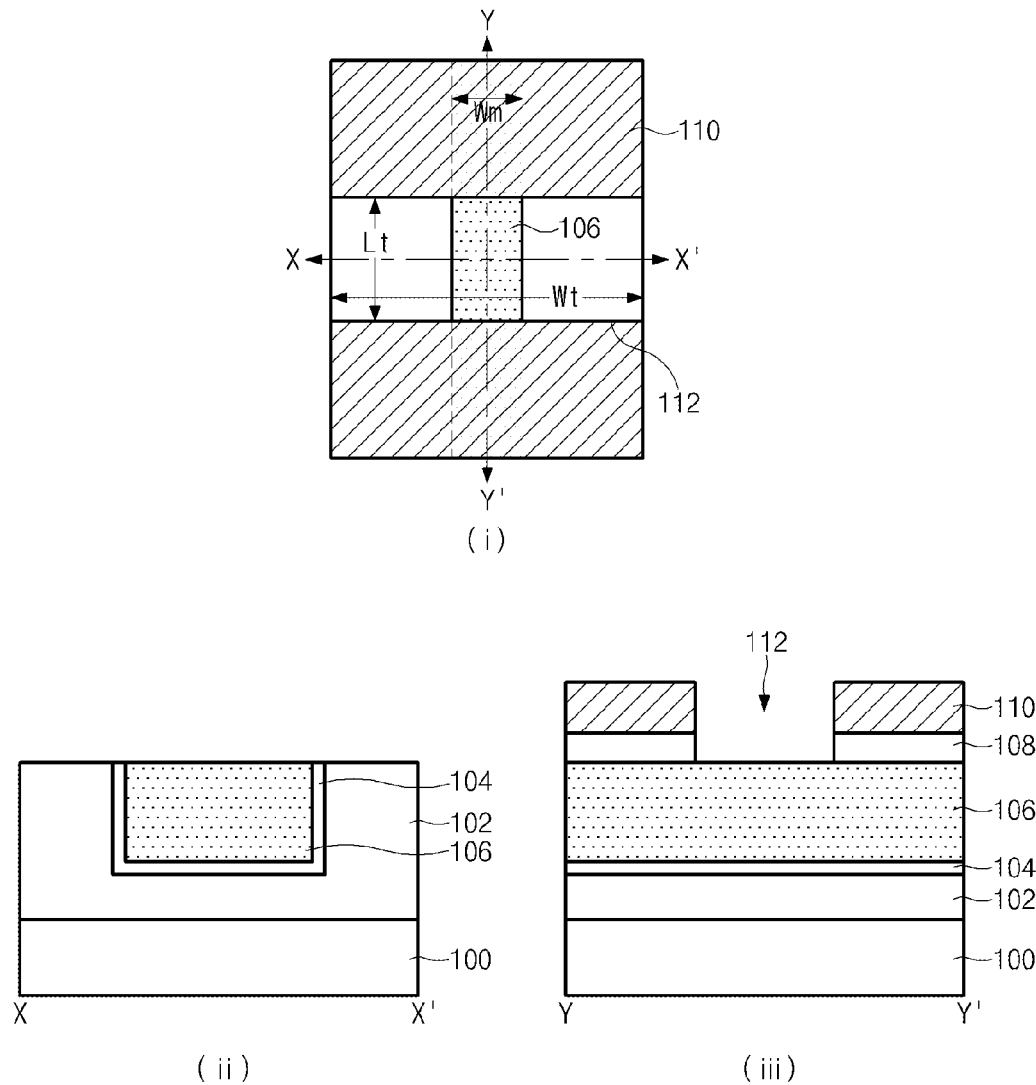

Referring to FIG. 3B, the first insulating layer 109 and a barrier insulation layer 108 are etched in a line/space pattern to expose the first metal line 106, such that the first insulating pattern 110 and a barrier insulation pattern 108 are formed. It is preferable that the trench 112 be formed along a direction perpendicular to the long-axis direction of the first metal line 106, i.e., formed along the direction of x-x'. It is preferable that the trench 112 be formed in the form of a line/space pattern or an island pattern having a width of 'Wt' and a length of 'Lt'. It is preferable that the length (Lt) of the trench 112 be formed larger than the width (Wm) of the first metal line 106. Because the length (Lt) of the trench 112 is involved in determining the size of the contact plug 123 (See FIG. 3H), it is preferable that the trench 112 have a larger length (Lt) in order to form the contact plug 123 as large as possible.

Figure 3C:
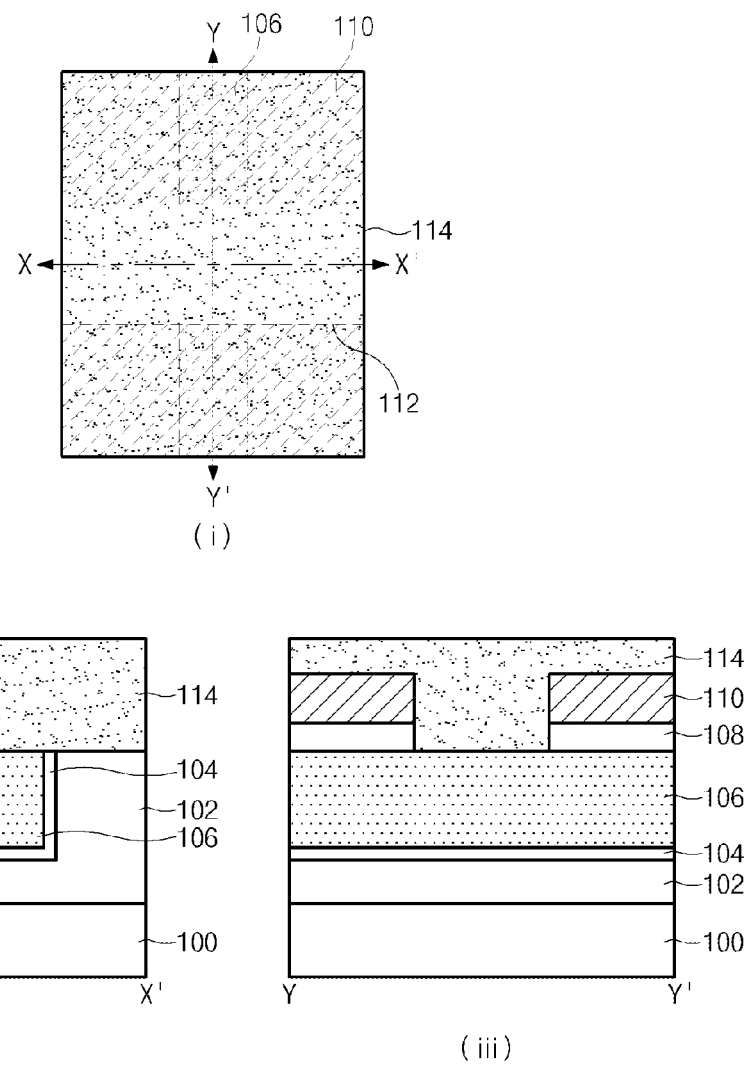

Referring to FIG. 3C, a second insulating layer 114 is formed over a first insulating pattern 110 including the trench 112. In this case, the second insulating layer 114 can be formed of carbon or another material having an etching ratio different from that of the first insulating pattern 110 and the third insulating pattern 118 (See FIG. 3E) formed in a subsequent process. It is preferable that the second insulating layer 114 be formed by a spin coater, Physical Vapor Deposition (PVD), Chemical Vapor Deposition (CVD), Atomic Layer Deposition (ALD), etc.

Figure 3D:
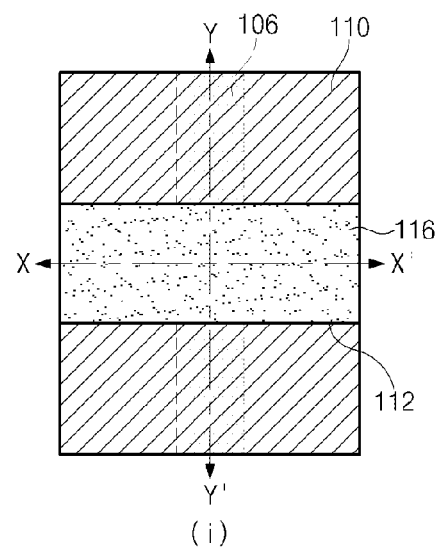
Figure 3D:
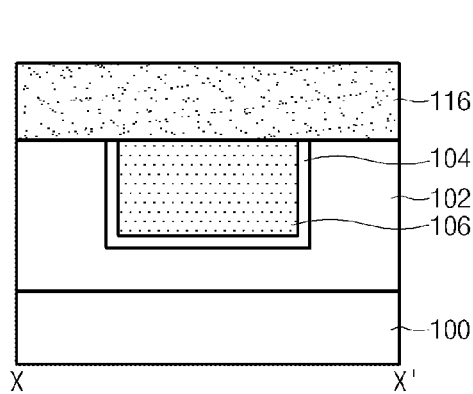
Figure 3D:
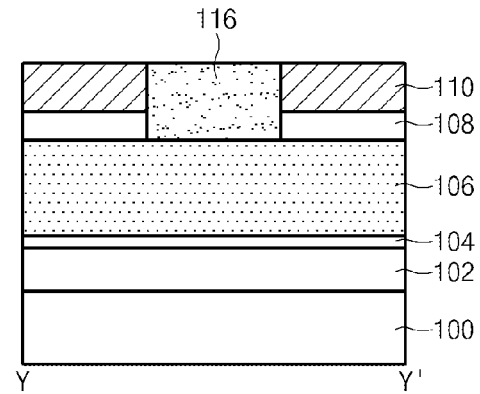

Referring to FIG. 3D, a planarization etching process or an etch-back process is performed on the second insulation layer 114 to expose the first insulating pattern 110, such that the second insulating pattern 116 buried in the trench 112 is formed.

Figure 3E:
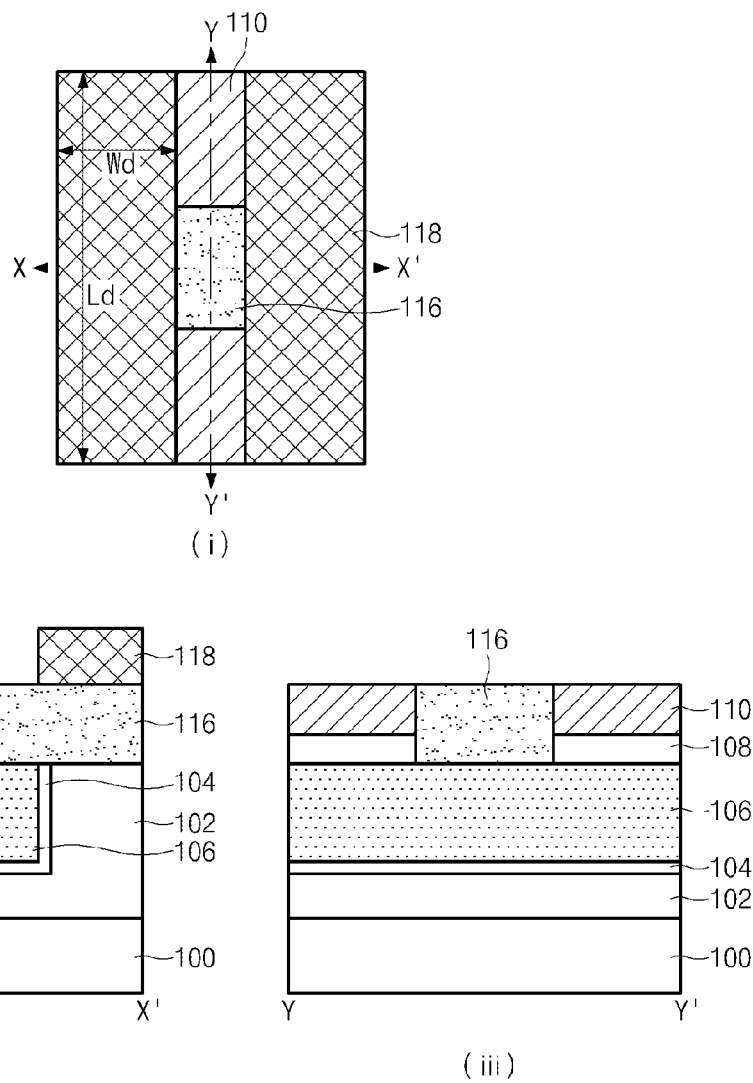

Referring to FIG. 3E, the third insulating pattern 118 is formed over the second insulating pattern 116 and the first insulating pattern 110. In this case, the third insulating pattern 118 may be formed along the y-y' direction along which the first metal line 106 is arranged, and may be formed to partially expose the second insulating pattern 116. It is preferable that a width (Wd) of the third insulating pattern 118 measured along the x-x' direction be about ⅔ to 1 times the width (Wm) of the first metal line 106 (See FIG. 3A). Since the width (Wd) of the third insulating pattern 118 determines the size of the contact plug 123 (See FIG. 3H), it is preferable to minimize the width (Wd) of the third insulating pattern 118 in order to enlarge the size of the contact plug 123. Accordingly, the width of the contact plug trench 120 (See FIG. 3F) formed in a subsequent process has the size of ⅔ of the first metal line width (Wm) or is formed to expose the entire width (Wm) of the first metal line. In this case, it is preferable that the second insulating pattern 116 exposed by the third insulation pattern 118 be square.

It is preferable that the third insulating pattern 118 be formed by a spin coater, Physical Vapor Deposition (PVD), Chemical Vapor Deposition (CVD), Atomic Layer Deposition (ALD), etc. In addition, it is preferable that the third insulating pattern 118 be formed of a nitride-, oxide-, or carbide-based material, or be formed of a polymer-based material having a low dielectric constant (low-K).

Figure 3F:
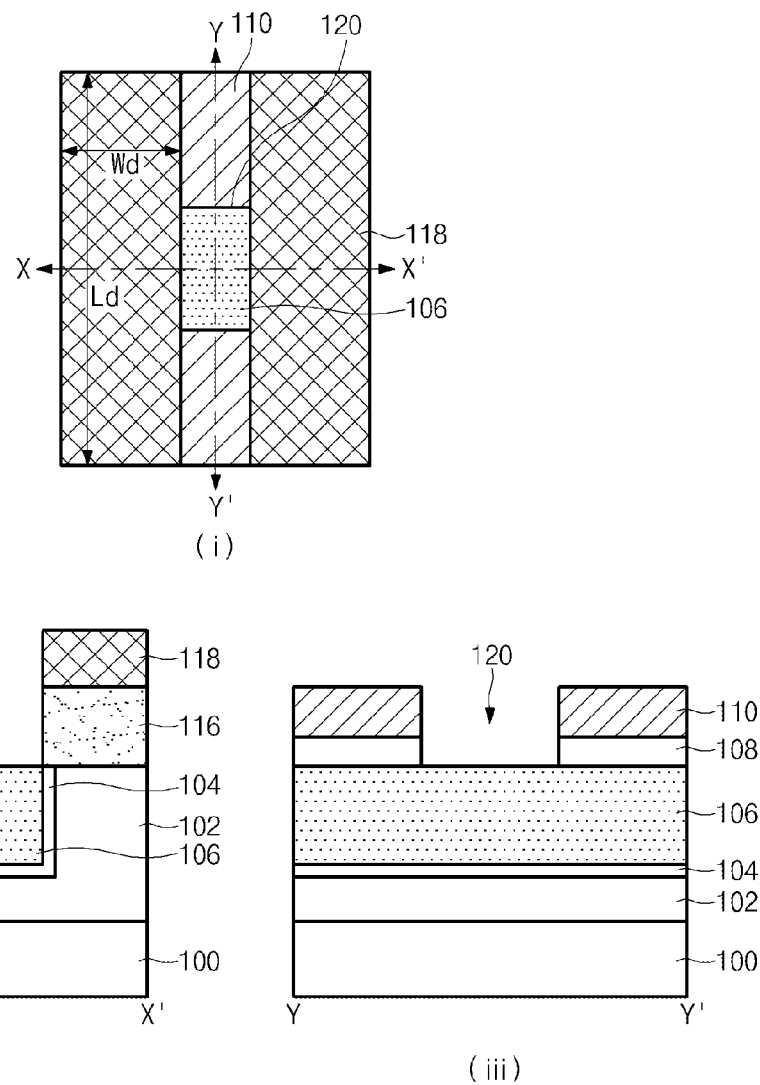

Referring to FIG. 3F, the second insulating pattern 116 is selectively etched using the third insulating pattern 118 and the first insulating pattern 110 as a mask to form the contact plug trench 120 exposing the first metal line 106. In this case, the second insulating pattern 116 has an etching ratio different from that of the first insulating pattern 110 and the third insulating pattern 118, so that the second insulating pattern 116 can be selectively etched without any loss of the first insulating pattern 110 and the third insulating pattern 118. It is preferable that the second insulating pattern 116 be etched by a dry etching method.

As described above, according to the semiconductor device of the present invention, the contact plug trench 120 is formed using the first insulating pattern 110 and the third insulating pattern 118 instead of using an exposure and development process. As a result, it is easier to form the trench 120 at a smaller scale. Accordingly, the semiconductor device according to the embodiment of the present invention can basically solve the problem of the related art that has difficulty in forming a small hole with a high aspect ratio for a highly integrated device. Also, the semiconductor device according to the present invention may employ a dual damascene process which is not efficient for the conventional art because the size of a contact hole is too small.

Figure 3G:
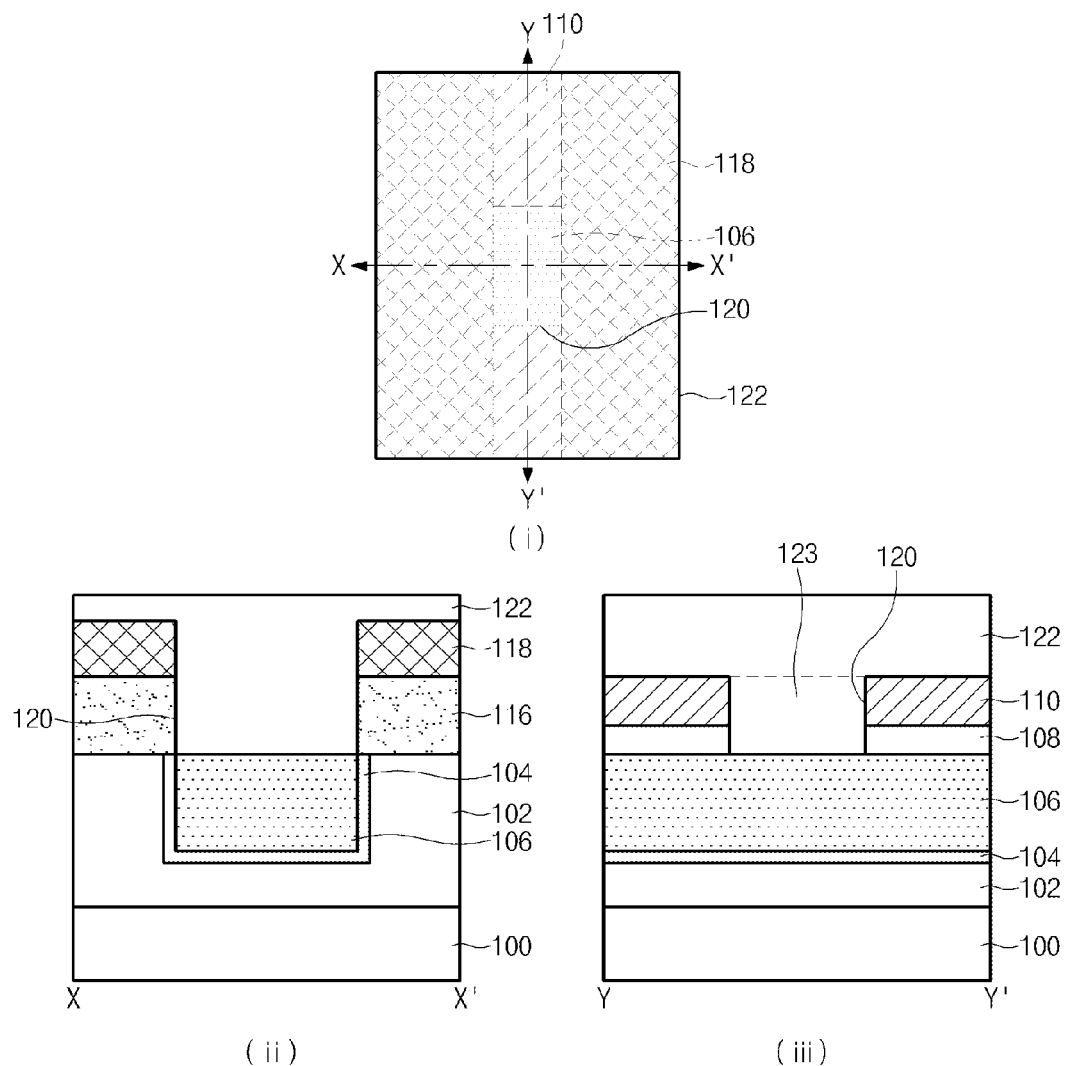

Referring to FIG. 3G, a conductive layer 122 is formed over the first insulating pattern 110 and the third insulating pattern 118 in such a manner that the contact plug trench 120 is filled with the conductive layer 122. Although not shown in FIG. 3G, if necessary, a barrier metal layer may also be formed before the conductive layer 122 is formed. The conductive layer 122 may be formed of Cu, Al, W, Ti, TiN, Ta, TaN, a conductive oxide, or a combination thereof. In addition, the conductive layer 122 may also be configured in the form of a laminated structure including a silicide material, a silicate material, or a conductive oxide material.

Figure 3H:
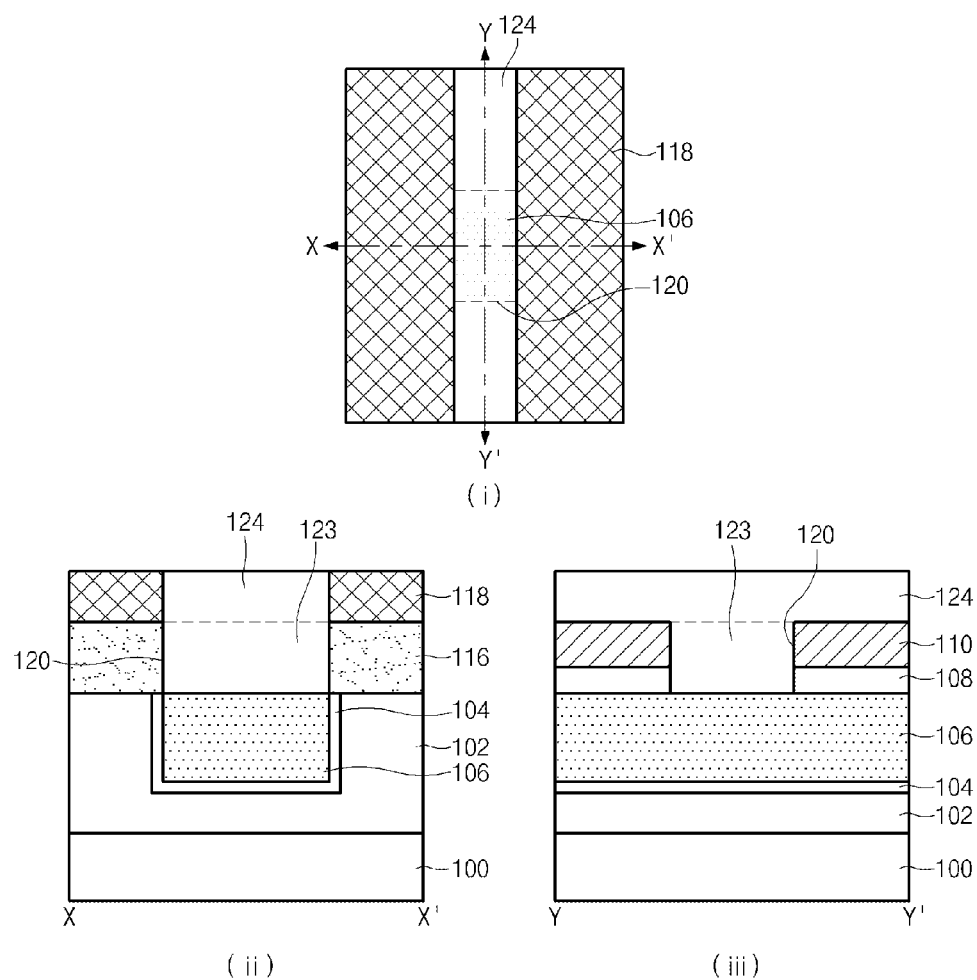

Referring to FIG. 3H, a planarization etching process is performed over the conductive layer 122 in such a manner that the third insulating pattern 118 is exposed, and so that a second metal line 124 is formed above the contact plug 123 buried in the contact plug trench 120 and the between the third insulating patterns 118. Although the second metal line 124 and the contact plug 123 are simultaneously formed in the present invention for convenience of description and better understanding of the present invention, the scope or spirit of the present invention is not limited thereto, and the second metal line 124 may also be formed after the contact plug 123 is formed as necessary.

As described above, according to the semiconductor device of the present invention, a contact hole using an exposure mask. is not formed. Instead, a relatively shallow trench reserved for the contact plug is formed using two crossing line patterns, i.e., the first insulation pattern 110 and the third insulation pattern 118. As a result, the contact hole can be more easily formed in the present invention, compared to the related art.

From the above description, it is apparent that the semiconductor device according to an embodiment of the present invention has the following advantages.

First, since the contact plug can be reliably formed without a void, a semiconductor device can operate at a high speed and with low power consumption.

Second, since a contact trench for a contact plug is relatively wide, it is possible to use the dual damascene process can be applied to form the plug.

Third, a variety of materials may be applied to the contact plug.

Fourth, a variety of materials may be applied to a metal line coupled to the contact plug.

Fifth, the contact plug may be formed in a small size.

Sixth, the embodiment of the present invention may prevent voids in a contact plug.

Seventh, the embodiment of the present invention may prevent copper migration even when copper is used for a contact plug.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a first metal line buried in an interlayer insulation layer formed over a semiconductor substrate;
    a pair of first insulating patterns formed over the interlayer insulating layer and defined by a line-shaped trench;
    a second insulating pattern filled between the pair of first insulating patterns; and
    a pair of third insulating patterns formed in line shapes and formed over the pair of first insulating patterns and over the second insulating pattern,
    wherein the pair of first and the pair of third insulating patterns in combination define a hole-shaped contact plug trench exposing a portion of an upper surface of the first metal line.

2. The semiconductor device according to claim 1, wherein the pair of first insulating patterns and the pair of third insulating patterns are arranged in directions perpendicular to each other.

3. The semiconductor device according to claim 1,
    wherein the exposed portion of the upper surface of the first metal line is $2/3 \sim 1$ times a width of the first metal line.

4. The semiconductor device according to claim 1, wherein the first metal line is exposed in a form of a square.

5. The semiconductor device according to claim 1, wherein the second insulating pattern has an etching ratio different from that of the pair of first insulating pattern or the pair of second insulating pattern.

6. The semiconductor device according to claim 1, wherein the second insulating pattern includes a carbon-based material.

7. The semiconductor device according to claim 1, wherein each of the pair of first insulating patterns and the pair of third insulating patterns includes a nitride-, oxide-, or carbide-based material, or includes a polymer-based material having a low dielectric constant (low-K).

8. The semiconductor device according to claim 1, further comprising:
    a contact plug provided in the contact plug trench so that the contact plug is coupled to the first metal line; and
    a second metal line coupled to the contact plug, wherein the second metal line is provided over the pair of first insulating patterns, and between the pair of third insulating patterns.

9. The semiconductor device of claim 1,
    wherein the pair of first insulating patterns are line-shaped patterns extending in a first direction, and
    wherein third pair of insulating patterns are line-shaped patterns extending in a second direction different from the first direction.

10. The semiconductor device of claim 9,
    wherein the first metal line is provided at a first level,
    wherein the pair of first insulating patterns are provided at a second level higher than the first level,
    wherein the second insulating pattern is provided at substantially the same level as the second level, and
    wherein the pair of third insulating patterns are provided at a third level higher than the second level.

11. The semiconductor device of claim 10,
    wherein the pair of first insulating patterns, the second insulating pattern, and the pair of third insulating patterns in combination define the hole-shaped contact plug trench.

12. A semiconductor device comprising:
    a semiconductor substrate;
    an interlayer insulating layer formed over the substrate;
    a first metal line buried in the interlayer insulating layer;
    a pair of first insulating patterns formed over the interlayer insulating layer, each formed in line patterns, and defined by a first line-shaped trench;
    a second insulating pattern filled between the pair of first insulating patterns; and
    a pair of third insulating patterns formed over the pair of first insulating patterns and the second insulating pattern and formed in line patterns miming across the pair of first insulating patterns to define a second line-shaped trench,
    wherein the pair of first and the pair of third insulating patterns in combination define a hole-shaped metal interconnection trench exposing a portion of an upper surface of the first metal line.

13. The semiconductor device of claim 12, the device further comprising:
    a metal interconnection plug at least substantially filling in the hole-shaped metal interconnection trench and being electrically coupled to the first metal line; and
    a second metal line filling the second line-shaped trench and electrically coupled to the hole-shaped metal interconnection plug.

14. The semiconductor device of claim 12,
    wherein the pair of first insulating patterns are arranged along a first direction, and the pair of third insulating patterns are arranged along a second direction perpendicular to the first direction.

15. The semiconductor device of claim 12,
    wherein the pair of first insulating patterns extend in a first direction, and
    wherein the pair of third insulating patterns extend in a second direction different from the first direction.

16. The semiconductor device of claim 15,
    wherein the first metal line is provided at a first level,
    wherein the pair of first insulating patterns are provided at a second level higher than the first level,
    wherein the second insulating pattern is provided at substantially the same level as the second level, and
    wherein the pair of third insulating patterns are provided at a third level higher than the second level.

17. The semiconductor device of claim 16,
    wherein the pair of first insulating pattern, the second insulating pattern, and the pair of third insulating patterns in combination define the metal interconnection trench.

* * * * *